(12) United States Patent
Maekawa

(10) Patent No.: US 6,893,954 B2
(45) Date of Patent: May 17, 2005

(54) METHOD FOR PATTERNING A SEMICONDUCTOR WAFER

(75) Inventor: Kaoru Maekawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/476,006

(22) PCT Filed: Jul. 23, 2002

(86) PCT No.: PCT/JP02/07452

§ 371 (c)(1),
(2), (4) Date: Oct. 27, 2003

(87) PCT Pub. No.: WO03/010814

PCT Pub. Date: Feb. 6, 2003

(65) Prior Publication Data

US 2004/0132277 A1 Jul. 8, 2004

(30) Foreign Application Priority Data

Jul. 23, 2001 (JP) ........................................ 2001-221897

(51) Int. Cl.[7] .......................................... H01L 21/4763
(52) U.S. Cl. ....................... 438/622; 438/638; 438/640; 438/673; 438/701; 438/734; 438/736
(58) Field of Search ................................ 438/622–623, 438/634, 636–640, 671–673, 685–688, 700–701, 709, 717, 734, 736–737, 740

(56) References Cited

U.S. PATENT DOCUMENTS

| | | | |
|---|---|---|---|
| 6,153,511 A | | 11/2000 | Watatani ...................... 438/623 |
| 6,551,445 B1 | * | 4/2003 | Yokogawa et al. .... 156/345.46 |
| 6,696,222 B2 | * | 2/2004 | Hsue et al. ................. 430/313 |
| 2002/0195711 A1 | * | 12/2002 | Usami ........................ 257/752 |

FOREIGN PATENT DOCUMENTS

| | | |
|---|---|---|
| JP | 2000-12546 A | 1/2000 |
| JP | 2000-36484 A | 2/2000 |
| JP | 2000-124306 | 4/2000 |
| JP | 2001-53151 A | 2/2001 |

* cited by examiner

Primary Examiner—Thanh Nguyen
(74) Attorney, Agent, or Firm—Crowell & Moring LLP

(57) ABSTRACT

A method of efficiently fabricating a semiconductor device with less fabrication steps is provided. A second inter-layer insulation film is removed to form an aperture by substantially using a first hard mask film as a mask in accordance with the method of fabricating a semiconductor device having a multi-layer wiring structure using a dual-damascene method. In addition, an etching stopper film is removed, and then a first inter-layer insulation film is removed to form a via hole in the first inter-layer insulation film.

4 Claims, 6 Drawing Sheets

METHOD FOR PATTERNING A SEMICONDUCTOR WAFER

TECHNICAL FIELD

The present invention relates to a method of fabricating a semiconductor device, and more particularly to a method of efficiently fabricating a semiconductor device having a multi-layer wiring structure with less fabrication steps.

BACKGROUND ART

Recent miniaturization of semiconductor devices has made it possible to fabricate a cutting edge semiconductor device having a larger number of semiconductor elements on the substrate thereof. When the semiconductor elements on the substrate of the semiconductor device are connected each other, it is insufficient that the semiconductor device is configured as a single wiring layer. For this reason, a so-called multi-layer wiring structure, which is configured by layering a plurality of wiring layers via inter-layer insulation films, is adopted to configure such a semiconductor device.

In particular, multi-layer wiring structures in accordance with a so-called dual-damascene method have been vigorously studied and developed in recent years. In the dual-damascene method, grooves as wiring portions (hereinafter which are referred to as "wiring grooves") and holes as via contacts (hereinafter which are referred to as "via holes") are formed in an inter-layer insulation film in advance, and a wiring layer is formed by filling a conductive material into the wiring grooves and the via holes.

The dual-damascene method has many variations. Japanese Laid-Open Patent Application No. 2000-124306 discloses a method of fabricating a semiconductor device by using an inter-layer insulation film. FIGS. 1A through 2D show such a method of fabricating a multi-layer wiring structure having a dual-damascene structure by using an inter-layer insulation film.

Referring to FIG. 1A, a first wiring pattern 11 of Cu is formed on a substrate 10 via an insulation film (not illustrated), and an SiN film, which serves as a barrier film 12, is formed on the wiring pattern 11. Then, an organic SOG film, which serves as a first inter-layer insulation film 13, is formed on the barrier film 12. In addition, an $SiO_2$ film, which serves as an insulation film 14, is formed on the first inter-layer insulation film 13.

Furthermore, a second inter-layer insulation film 15 is formed on the insulation film 14. Then, two-layer structured hard mask films 16 and 17 are formed on the second inter-layer insulation film 15. Specifically, the first hard mask film 16 is formed of SiN of about 20 nm in thickness, and the second hard mask film 17 is formed of $SiO_2$ of about 100 nm in thickness. These hard mask films 16 and 17 are often called etching stoppers.

After formation of the second hard mask film 17, a resist pattern 20 having an aperture 20A corresponding to a wiring groove that is expected to be formed in the second inter-layer insulation film 15 is formed on the second hard mask film 17 at the fabrication step shown in FIG. 1B. In order to pattern the second hard mask film 17, dry etching using a $CF_4/Ar$ material is performed on the second hard mask film 17 by using the resist pattern 20 as a mask at the fabrication step shown in FIG. 1C. Subsequently, the resist pattern 20 is removed through ashing. Through patterning on the second hard mask film 17, an aperture 17A corresponding to the aperture 20A is formed in the second hard mask film 17. In this configuration, the first hard mask film 16 is exposed via the aperture 17A.

As shown in FIG. 1D, a resist pattern 21 having an aperture 21A corresponding to a via hole that is expected to be formed in the first inter-layer insulation film 13 is formed. At the fabrication step shown in FIG. 1E, the first hard mask film 16 is patterned by using the resist pattern 21 as a mask, and then the second inter-layer insulation film 15 is dry-etched. At this time, the insulation film 14 works as an etching stopper. Subsequently, the resist pattern 21 is removed through ashing or the like.

At the fabrication step shown in FIG. 2A, an exposed portion of the first hard mask film 16 is removed through dry etching by using the second hard mask film 17 as a mask. At the same time, the insulation film 14 is also removed.

At the fabrication step shown in FIG. 2B, the first and second inter-layer insulation films 13 and 15 are patterned through dry etching by using the remaining portion of the second hard mask film 17 as a mask. At the same time, a wiring groove 25 and a via hole 26 are simultaneously opened. At this time, the insulation film 14 works as a mask for forming the via hole 26.

At the fabrication step shown in FIG. 2C, an exposed portion of the barrier film 12 under the via hole 26 is removed through dry etching. At the fabrication step shown in FIG. 2D, a Cu film 30 is accumulated to fill the via hole 26 and the wiring groove 25 of the configuration shown in FIG. 2C, and then an extra portion of the Cu film 30 on the second hard mask film 17 is removed in accordance with a chemical machine polishing (CMP) method. As a result, it is possible to form a Cu wiring pattern that properly fills the via hole 26 and the wiring groove 25.

However, the above-mentioned method of fabricating a semiconductor device has many fabrication steps, resulting in an adverse effect on yield of the semiconductor device. As a result, it is impossible to prevent an increase in fabrication cost of the semiconductor device.

DISCLOSURE OF INVENTION

It is an object of the present invention to provide a novel and useful method of fabricating a semiconductor device with less fabrication steps than conventional semiconductor device fabrication methods in which one or more of the above-mentioned problems are eliminated.

A more specific object of the present invention is to provide a method of efficiently fabricating a semiconductor device having a dual-damascene structure.

In order to achieve the above-mentioned objects, there is provided according to one aspect of the present invention a method of fabricating a semiconductor device including the steps of forming a first inter-layer insulation film on a barrier film on a substrate; forming a second inter-layer insulation film on the first inter-layer insulation film; forming a first hard mask film on the second inter-layer insulation film; forming a second hard mask film different from the first hard mask film on said first hard mask film, including: a step of forming a first aperture in the second hard mask film to expose the first hard mask film by using a desired resist pattern formed on the second hard mask film as a mask; a step of forming a second aperture in the exposed first hard mask film by using a desired resist pattern formed on the first and the second hard mask films as a mask; a first removal step of removing the second inter-layer insulation film to form an aperture corresponding to the second aperture in the second inter-layer insulation film by using the first hard mask film as a mask; a second removal step of forming a via hole corresponding to the second aperture in the first inter-layer insulation film and removing the first inter-layer insulation film to expose the barrier film by using the first hard mask film as a mask; a third removal step of removing the first hard mask film and the barrier film exposed in a bottom of the via hole simultaneously by using the second hard mask film as a mask; and a fourth removal step of removing the second inter-layer insulation film to form a wiring groove corresponding to the first aperture in the second inter-layer insulation film by using the second hard mask film as a mask.

In an embodiment of the present invention, the fourth removal step may be conducted through plasma etching using a gas including N and H.

In an embodiment of the present invention, the second inter-layer insulation film may be an organic film having a low dielectric constant.

An embodiment of the present invention may further include a step of forming an etching stopper film after the step of forming the first inter-layer insulation film before the step of forming the second inter-layer insulation film, wherein the second removal step removes the etching stopper film together with the first inter-layer insulation film.

According to one aspect of the present invention, in a method of fabricating a semiconductor device having a substrate, a barrier film formed on the substrate, a first inter-layer insulation film formed on the barrier film, a second inter-layer insulation film formed on the first inter-layer insulation film, a first hard mask formed on the second inter-layer insulation film, a second hard mask film formed on the first hard mask film, the second inter-layer insulation film is removed to form an aperture by substantially using the first hard mask film having an aperture as a mask, and then the first inter-layer insulation film is removed to expose the barrier film. Subsequently, the first hard mask film is and the barrier film exposed in the bottom of the via hole are simultaneously removed by using the second hard mask film having an aperture as a mask. As a result, it is possible to decrease the number of fabrication steps compared to conventional fabrication methods. Then, a structure having a wiring groove and a via hole is formed by removing the second inter-layer insulation film. The step of removing the second inter-layer insulation film is conducted through plasma etching using a gas including N. As a result, it is possible to form a wiring groove without damaging an exposed surface of Cu as a conductive material under the barrier film during etching.

Other objects, features and advantages of the present invention will become more apparent from the following detailed description when read in conjunction with the accompanying drawings.

BEST MODE FOR CARRYING OUT THE INVENTION

A description will now be given, with reference to the accompanying drawings, of a preferred embodiment of a method of fabricating a semiconductor device according to the present invention (hereinafter which is referred to as an embodiment of the present invention).

Figure 1A:
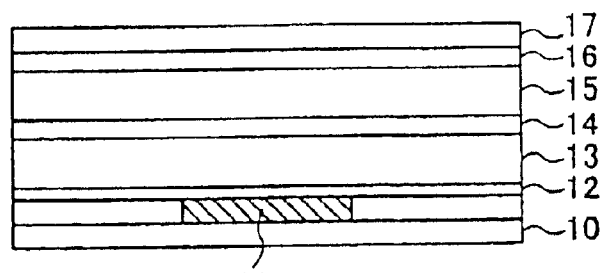
FIGS. 1A through 1E are diagrams illustrating a first half of a process to fabricate a conventional semiconductor device.
Figure 1B:
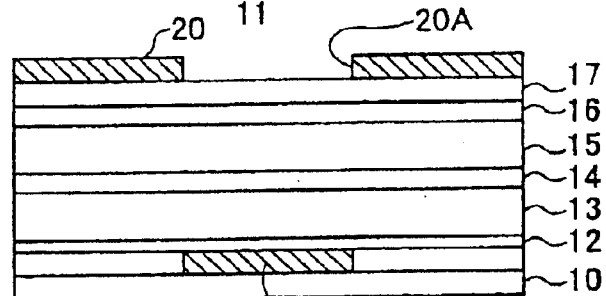
Figure 1C:
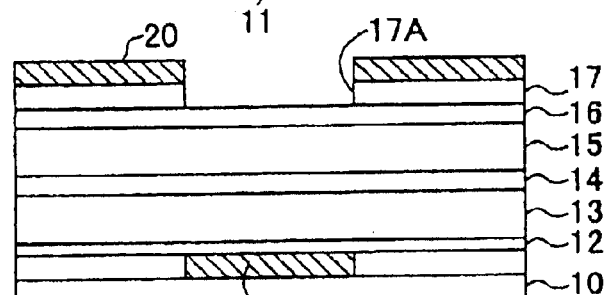
Figure 1D:
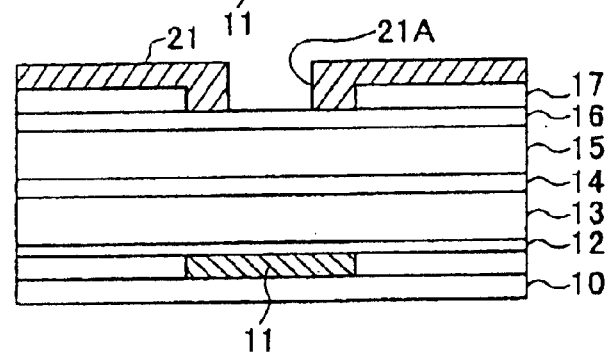
Figure 1E:
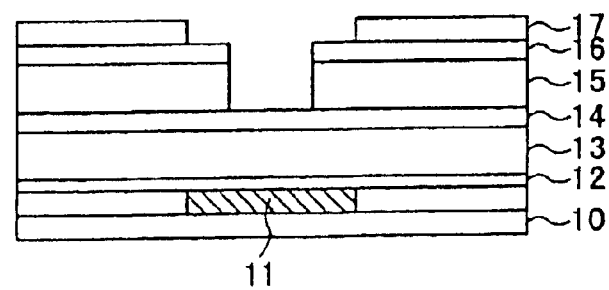
Figure 2A:
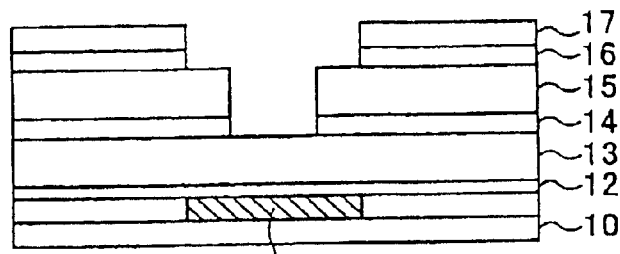
FIGS. 2A through 2D are diagrams illustrating a second half of the process to fabricate the conventional semiconductor device.
Figure 2B:
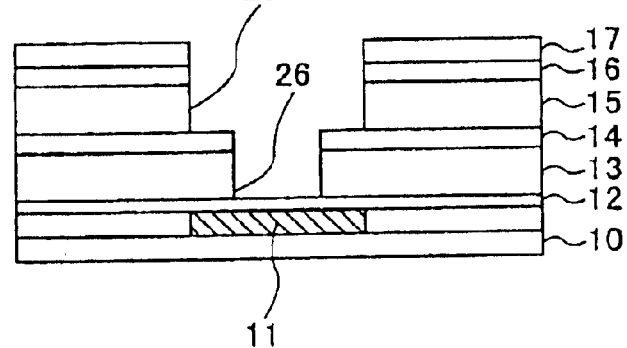
Figure 2C:
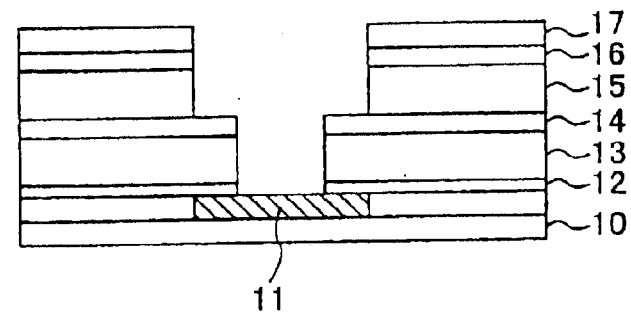
Figure 2D:
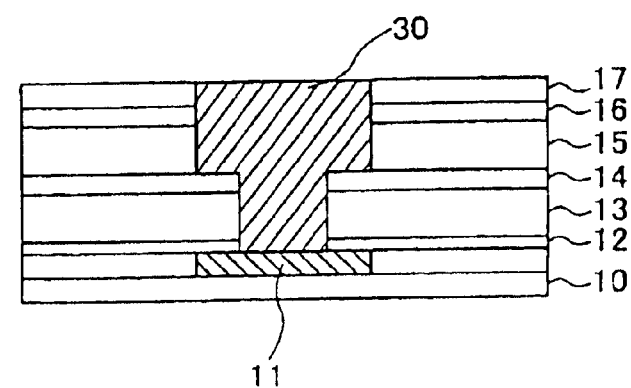
Figure 3:
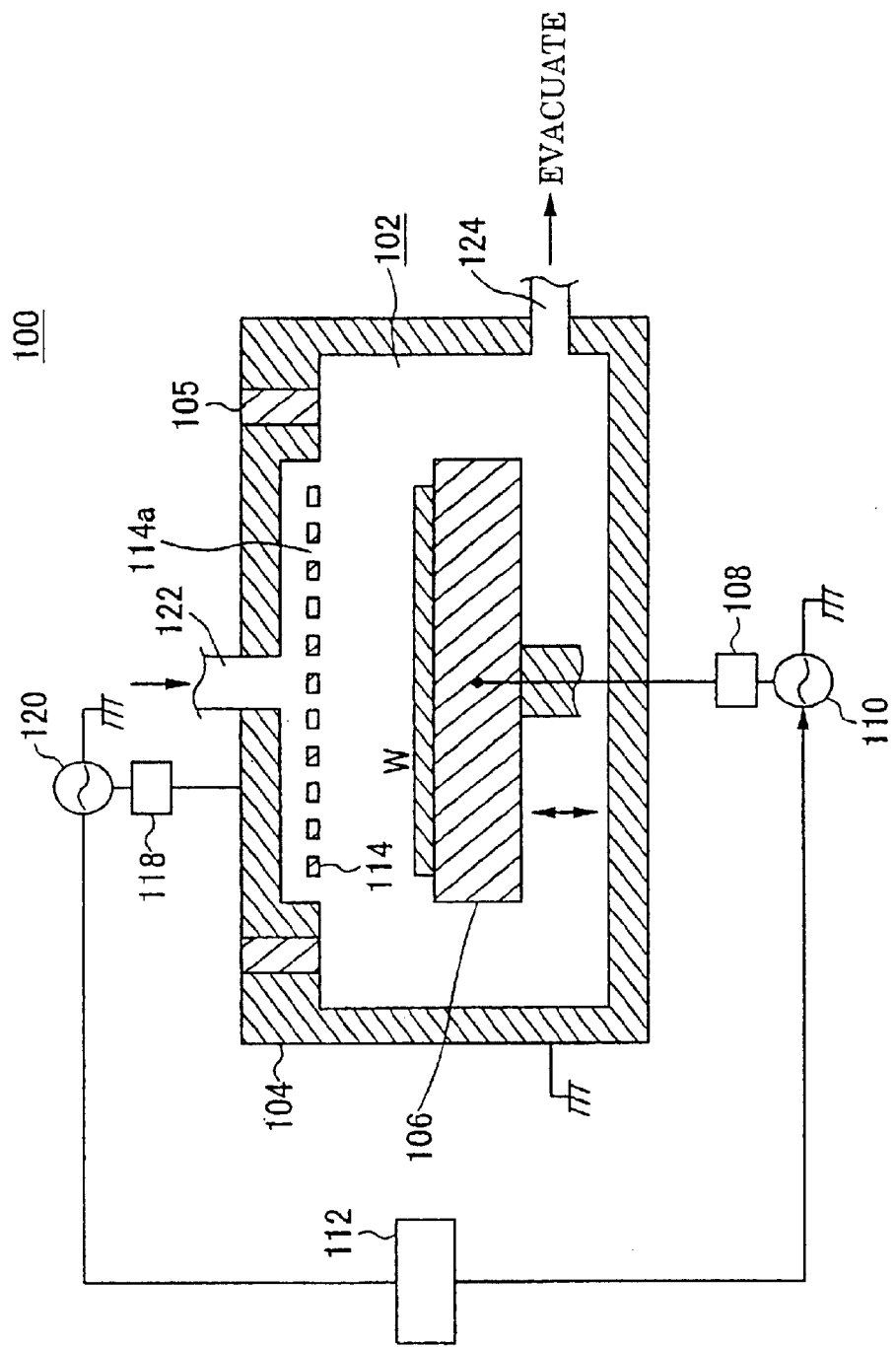
FIG. 3 is a cross-sectional view of a plasma processing apparatus used for the present invention.

FIG. 3 shows an exemplary structure of a plasma processing apparatus 100 used for embodiments of the present invention. Referring to FIG. 3, the plasma processing apparatus 100 comprises a reaction container 104 including a processing chamber 102 accommodating a support platform 106 to support a processed substrate W. An upper portion of the reaction container 104 is electrically insulated from the other portion of the reaction container 104 by an insulation member 105. A shower head 114 to supply a plasma gas from a line 122 is disposed to face the processed substrate W on the support platform 106. The shower haed 114 includes a large number of apertures 114a, and the plasma gas supplied from the line 122 is implanted toward the processed substrate W on the support platform 106 via the apertures 114a. On the other hand, the plasma gas in the processing chamber 102 is evacuated via an evacuation port 124.

High-frequency electric power of 2 MHz is supplied from a bias power supply 110, which is controlled by a controller 112, to the support platform 106 via an adjuster 108. On the other hand, high-frequency electric power of 60 MHz is supplied from a plasma excitation power supply 120, which is controlled by the controller 112, to the shower head 114 via an adjuster 118. As a result, plasma can be generated between the support platform 106, which serves as a lower electrode, and the shower head 114, which serves as an upper electrode.

According to the present invention, an inter-layer insulation film or the like on the processed substrate W is processed by using the plasma.

FIGS. 4A through 6B show a process to fabricate a semiconductor device having a multi-layer wiring structure according to the present invention. For simplicity, only a formation portion of a multi-layer wiring structure is illustrated, and a formation portion of an active element is not described herein.

Figure 4A:
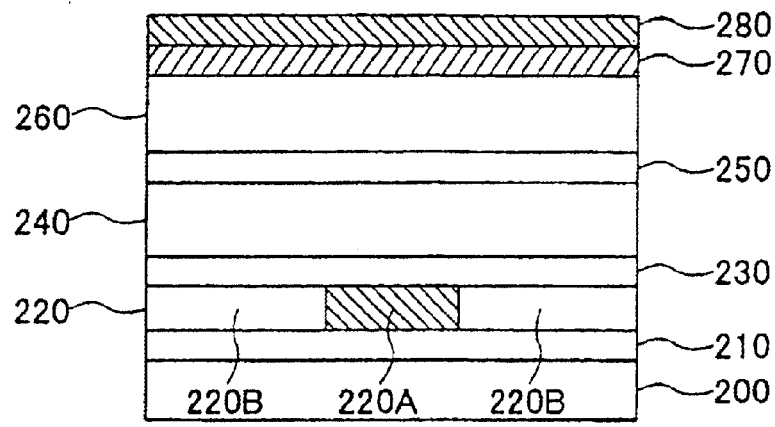
FIGS. 4A through 4C are diagrams illustrating a first stage of a process to fabricate a semiconductor device according to an embodiment of the present invention.

Referring to FIG. 4A, an Si substrate 200, on which an active element (not illustrated) such as a MOS transistor is formed, is covered with an inter-layer insulation film 210 of CVD-$SiO_2$ and so on, and a wiring pattern 220A of Cu is formed on the inter-layer insulation film 210. The wiring pattern 220A is embedded in an inter-layer insulation film 220 on the inter-layer insulation film 210. A wiring layer 220, which comprises the wiring pattern 220A and the inter-layer insulation film 220B, is covered with a barrier film 230 formed of SiN or the like in accordance with a plasma CVD method.

The barrier film 230 is covered with a first inter-layer insulation film 240. An etching stopper film 250 of SiN or the like is formed on the first inter-layer insulation film 240. The etching stopper film may be formed of an SiON film or SiOC film.

In the illustrated embodiment, a second inter-layer insulation film 260 is formed on the etching stopper film 250. In addition, a first hard mask film 270 is layered on the second inter-layer insulation film 260, and a second hard mask film 280, which is different from the first hard mask film 270, is layered on the first hard mask film 270. Specifically, the hard mask films 270 and 280 may be configured from various combinations, for example, a combination of the first hard mask film 270 of an SiN film and the second hard mask film 280 of an $SiO_2$ film, a combination of the first hard mask film 270 of an SiON film and the second hard mask film 280 of an $SiO_2$ film, a combination of the first hard mask film 270 of selected one of an $SiO_2$ film, an SiON film, an SiN film and an SiC film and the second hard mask film 280 of an amorphous Si film, and a combination of the first hard mask film 270 of selected one of an $SiO_2$ film, SiN film and an SiC film and the second hard mask film of a TiN film. However, the hard mask films 270 and 280 according to the present invention is not limited to the above-mentioned combinations. Typically, the hard masks 270 and 280 can be formed in accordance with the plasma CVD method. However, other film formation methods may be used.

In the illustrated embodiment, the first inter-layer insulation film 240 may be formed of an organic film and/or an inorganic film. A spin coat method or the plasma CVD method may be used as a film formation method to form the first inter-layer insulation film 240. It is preferable that the second inter-layer insulation film 260, which is finally configured as a wiring layer, can be etched by a gas including N (nitrogen) and H (hydrogen). In order to overcome a recent wiring delay problem, it is preferable to use an organic inter-layer insulation film having a dielectric constant lower than those of conventional inter-layer insulation films. Specifically, Silk (Registered Trademark) produced by Dow Chemical Company is a kind of such an organic inter-layer insulation film.

In the following, a multi-layer wiring structure having the etching stopper film 250 between the first and the second insulation films is described. However, a semiconductor device fabrication method according to the present invention is also applicable to a multi-layer wiring structure having no etching stopper film 250.

Figure 4B:
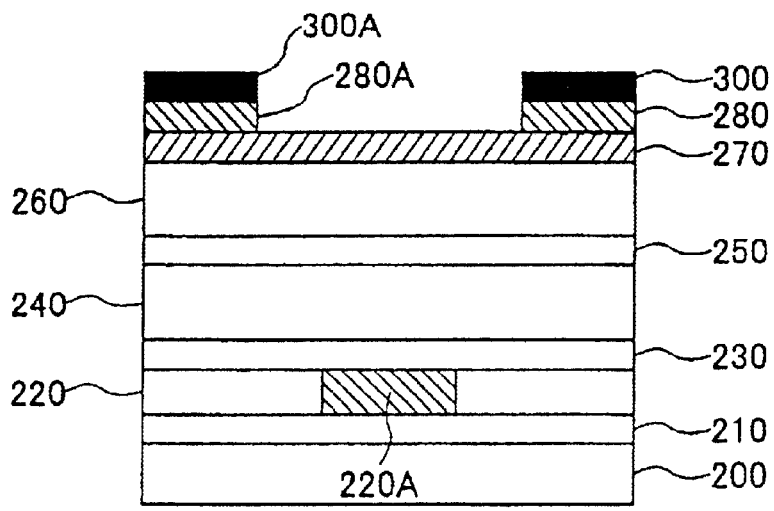

At the fabrication step shown in FIG. 4B, a resist pattern 300 having an aperture 300A corresponding to a desired wiring groove is formed on the second hard mask film 280 in accordance with a photolithography process. Then, the second hard mask film 280 is removed, for example, through dry etching using a $CF_4$/Ar material by using the resist pattern 300 as a mask. As a result, it is possible to form an aperture 280A corresponding to the wiring groove in the second hard mask film 280. Subsequently, the resist pattern 300 is removed through ashing by exposing the resist pattern 300 in atmosphere of oxygen radical. As a result, the first hard mask film 270 is exposed via the aperture 280A in the second hard mask film 280.

Figure 4C:
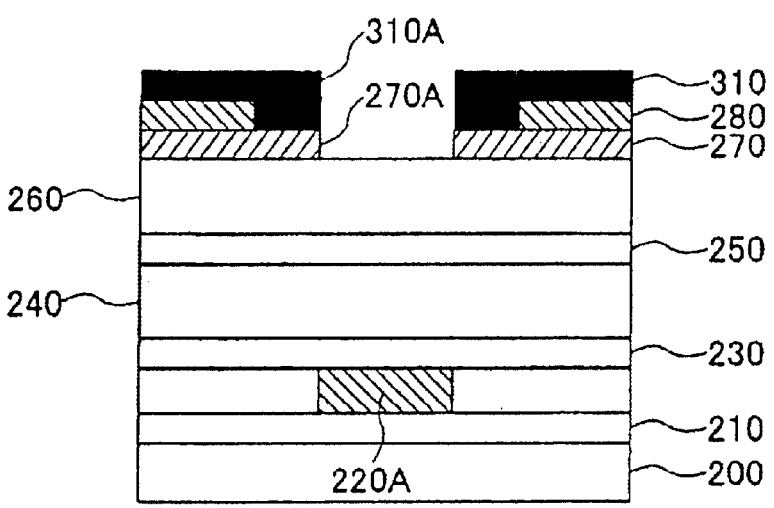

At the fabrication step shown in FIG. 4C, a resist pattern 310 having an aperture 310A corresponding to a desired via hole is formed on the first hard mask film 270 and the second hard mask film 280 in accordance with the photolithography process. Then, the first hard mask film 270 is removed through dry etching using a $CF_4$/Ar material by using the resist pattern 310 as a mask. As a result, it is possible to form an aperture 270A corresponding to the via hole in the first hard mask film 270 and expose the second inter-layer insulation film 260 via the via hole.

Figure 5A:
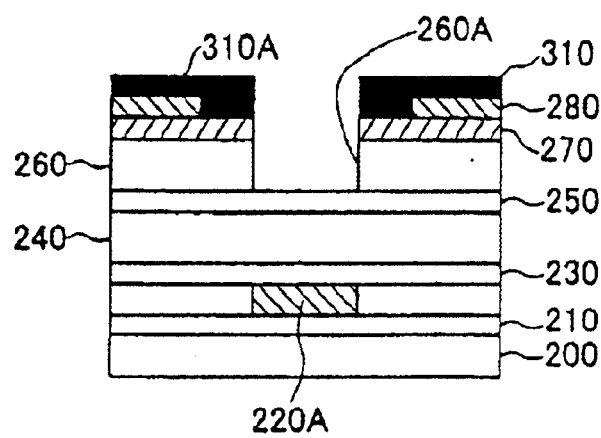
FIGS. 5A through 5D are diagrams illustrating a second stage of the process to fabricate the semiconductor device according to the embodiment of the present invention.

At the fabrication step shown in FIG. 5A, the second inter-layer insulation film 260 is removed through dry etching using a gas including N (nitrogen) and H (hydrogen) in the plasma processing apparatus shown in FIG. 3 by using the resist pattern 310 configured at the fabrication step in FIG. 4C as a mask, in other words, by substantially using the first hard mask film 270 as the mask, and an aperture 260A corresponding to the aperture 310A is formed.

Subsequently, the etching stopper film 250 is removed corresponding to an aperture 270A in the first hard mask film 270 through dry etching using a CF gas in the plasma processing apparatus in FIG. 3 by using the first hard mask film 270 as a mask, as illustrated in the fabrication step in FIG. 5B, and then the first inter-layer insulation film 240 is also removed. As a result, it is possible to form a via hole 240A corresponding to the aperture 270A in the first inter-layer insulation film 240. In the illustrated embodiment, the case where the etching stopper film 250 is between the first and the second inter-layer insulation films has been described. However, if there is no etching stopper film 250, it is possible to more easily perform etching.

Figure 5B:
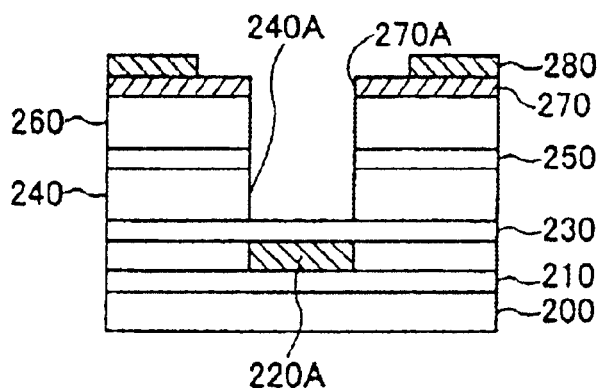

At the fabrication step shown in FIG. 5B, it will be understood by those skilled in the art that if the etching stopper film 250 does not exist, the process shown in FIG. 5B can be performed by adequately adjusting the above-mentioned etching condition.

Figure 5C:
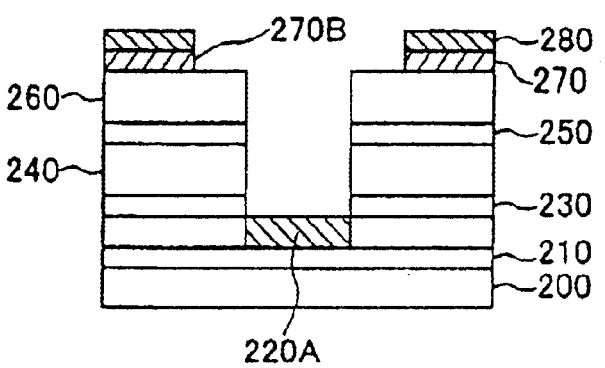

Furthermore, the first hard mask film 270 and the barrier film 230 are simultaneously removed through dry etching using a CF gas in the plasma processing apparatus in FIG. 3 by using the second hard mask film 280 as a mask, as illustrated in FIG. 5C. As a result, it is possible to form an aperture 270B corresponding to the aperture 280 greater than the aperture 270A. According to this fabrication step, it is possible to decrease the number of the semiconductor device fabrication steps. Accordingly, it is possible to make the semiconductor device fabrication process more efficient, that is, it is possible to achieve the purpose of the present invention.

Figure 5D:
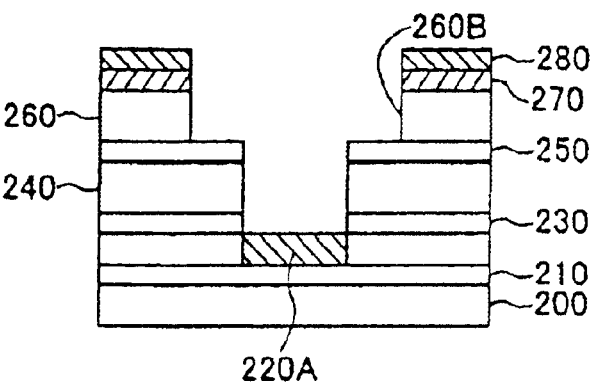

At the fabrication step shown in FIG. 5D, the second inter-layer insulation film 260 is removed through dry etching in the plasma processing apparatus in FIG. 3 by using the second hard mask film 280 as a mask, thereby forming a wiring groove 260B corresponding to the aperture 270B in the second inter-layer insulation film 260.

As mentioned above, it is preferable that the second inter-layer insulation film 280 according to the present invention be an organic film. Although an $O_2$ gas is conventionally used to etch an inter-layer insulation film being an organic insulation film, the $O_2$ gas is not preferable for the present invention. It is preferable to use a gas including not oxygen but N as a plasma etching gas according to the present invention. Since a surface of Cu 220A exposed at the fabrication step shown in FIG. 5C is easily oxidized during the dry etching, such a gas including not oxygen but N should be used to prevent oxidization of the exposed Cu surface. The gas including not oxygen but N has an additional advantage in that the nitrogen and the copper react each other through the gas including N, thereby forming a protective film on the exposed Cu surface during the dry etching. The formation of such a protective film makes it possible to obtain a secondary effect in that the Cu surface cannot be damaged while the semiconductor device is being carried in atmosphere.

Specifically, $N_2$, $NH_3$ and a mixture thereof may be used as the gas including N. Alternatively, it is preferable to use a gas including H as a plasma etching gas. Specifically, $H_2$ and a mixture thereof may be used as the gas including H.

When a gas including N and H is used for plasma etching, there is an additional effect in that an organic matter, which may remain as an impurity when the first and the second inter-layer insulation films are etched, can be easily removed.

Figure 6A:
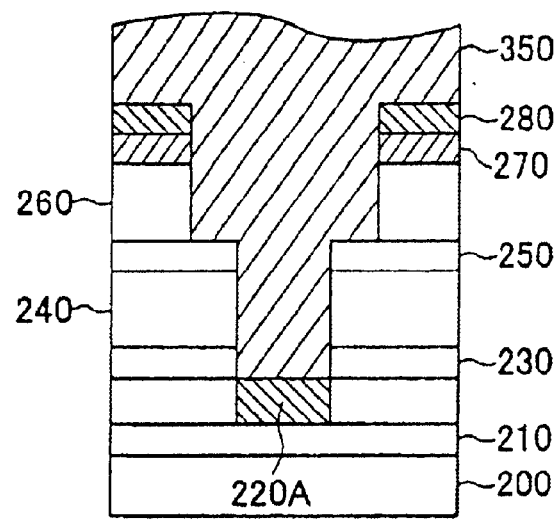
FIGS. 6A and 6B are diagrams illustrating a third stage of the process to fabricate the semiconductor device according to the embodiment of the present invention.
Figure 6B:
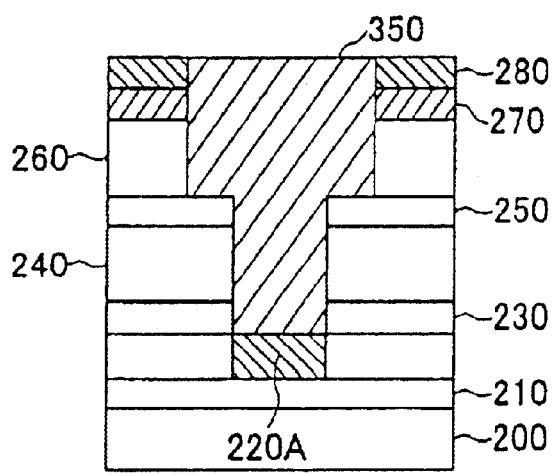

Subsequently, a conductive material 350 of Al, Cu or the like is filled in the wiring groove 260B and the via hole 240A in accordance with the CVD method or the PVD method, as illustrated in FIG. 6A. Then, it is possible to obtain a wiring pattern in which the wiring pattern 220A is connected via the via hole 240A by polishing an unnecessary portion of the conductive material 350 in accordance with a CMP method at the fabrication step shown in FIG. 6B. Furthermore, if the above-mentioned process is repeatedly performed, it is possible to form the third and fourth layer wiring patterns.

The preferred embodiments of the present invention have been described hereto. However, the present invention is not limited to the specifically disclosed embodiments, and variations and modifications may be made without departing from the scope of the present invention.

What is claimed is:

1. A method of fabricating a semiconductor device including the steps of forming a first inter-layer insulation film on a barrier film on a substrate; forming a second inter-layer insulation film on the first inter-layer insulation film; forming a first hard mask film on the second inter-layer insulation film; forming a second hard mask film different from the first hard mask film on said first hard mask film, comprising:

a step of forming a first aperture in the second hard mask film to expose the first hard mask film by using a desired resist pattern formed on the second hard mask film as a mask;

a step of forming a second aperture in the exposed first hard mask film by using a desired resist pattern formed on the first and the second hard mask films as a mask;

a first removal step of removing the second inter-layer insulation film to form an aperture corresponding to the second aperture in the second inter-layer insulation film by using the first hard mask film as a mask;

a second removal step of forming a via hole corresponding to the second aperture in the first inter-layer insulation film and removing the first inter-layer insulation film to expose the barrier film by using the first hard mask film as a mask;

a third removal step of removing the first hard mask film and the barrier film exposed in a bottom of the via hole simultaneously by using the second hard mask film as a mask; and a fourth removal step of removing the second inter-layer insulation film to form a wiring groove corresponding to the first aperture in the second inter-layer insulation film by using the second hard mask film as a mask.

2. The method as claimed in claim 1, wherein the fourth removal step is conducted through plasma etching using a gas including N and H.

3. The method as claimed in claim 1, wherein the second inter-layer insulation film is an organic film having a low dielectric constant.

4. The method as claimed in claim 1, further comprising a step of forming an etching stopper film after the step of forming the first inter-layer insulation film before the step of forming the second inter-layer insulation film, wherein the second removal step removes the etching stopper film together with the first inter-layer insulation film.

* * * * *